(12) United States Patent
Tsuji et al.

(10) Patent No.: US 10,435,789 B2
(45) Date of Patent: Oct. 8, 2019

(54) SUBSTRATE TREATMENT APPARATUS

(71) Applicant: ASM IP Holding B.V., Almere (NL)

(72) Inventors: Naoto Tsuji, Tokyo (JP); Takuya Suguri, Hachioji (JP); Yozo Ikedo, Machida (JP)

(73) Assignee: ASM IP Holding B.V., Almere (NL)

( * ) Notice: Subject to any disclaimer, the term of this patent is extended or adjusted under 35 U.S.C. 154(b) by 211 days.

(21) Appl. No.: 15/370,834

(22) Filed: Dec. 6, 2016

(65) Prior Publication Data
US 2018/0158709 A1 Jun. 7, 2018

(51) Int. Cl.
| | |
|---|---|
| H01L 21/00 | (2006.01) |
| C23C 16/00 | (2006.01) |
| C23C 16/50 | (2006.01) |
| H01J 37/00 | (2006.01) |
| H01L 21/683 | (2006.01) |
| C23C 16/503 | (2006.01) |

(52) U.S. Cl.
CPC ............ *C23C 16/50* (2013.01); *C23C 16/503* (2013.01); *H01J 37/00* (2013.01); *H01L 21/6833* (2013.01)

(58) Field of Classification Search
CPC .................................................. H01J 37/32302
See application file for complete search history.

(56) References Cited

U.S. PATENT DOCUMENTS

| | | | |
|---|---|---|---|
| 5,366,585 A | 11/1994 | Robertson et al. | |
| 6,024,044 A * | 2/2000 | Law ..................... | C23C 16/5096 118/723 E |
| 6,171,438 B1 * | 1/2001 | Masuda ............. | H01J 37/32504 118/715 |
| 2002/0031617 A1 * | 3/2002 | Sumiya ............... | C23C 16/4401 427/569 |
| 2003/0037881 A1 * | 2/2003 | Barnes .............. | H01J 37/32082 156/345.44 |
| 2005/0236111 A1 * | 10/2005 | Higashiura ....... | H01J 37/32082 156/345.47 |
| 2007/0235135 A1 * | 10/2007 | Nishio ............... | H01J 37/32091 156/345.28 |
| 2008/0182418 A1 * | 7/2008 | Collins ............. | C23C 16/45574 438/710 |
| 2008/0308041 A1 * | 12/2008 | Koshiishi .......... | H01J 37/32082 118/715 |
| 2009/0236214 A1 * | 9/2009 | Janakiraman ..... | C23C 16/45565 204/164 |

\* cited by examiner

*Primary Examiner* — Sylvia MacArthur
*Assistant Examiner* — Michelle Crowell
(74) *Attorney, Agent, or Firm* — Studebaker & Brackett PC

(57) ABSTRACT

A substrate treatment apparatus includes a lower electrode, an upper electrode, a first AC power supply that is connected to the upper electrode and supplies AC power at a first frequency, a second AC power supply that is connected to the upper electrode and supplies AC power at a second frequency which is lower than the first frequency, an internal electrode provided in the lower electrode, a filter circuit connected to the internal electrode, and a DC power supply connected to the internal electrode via the filter circuit. The filter circuit includes a first filter circuit that becomes low impedance with respect to AC power at the first frequency compared to AC power at the second frequency, and a second filter circuit that becomes low impedance with respect to AC power at the second frequency compared to AC power at the first frequency.

7 Claims, 4 Drawing Sheets

| | | Hz | |
|---|---|---|---|
| | | 4.30E+05 [Hz] | 1.36E+07 [Hz] |
| Capacitance | 6.00E-10 [F] | 617 [Ω] | 20 [Ω] |
| | 2.00E-09 [F] | 185 [Ω] | 6 [Ω] |
| | 1.25E-08 [F] 2500pF×5 | 30 [Ω] | 0.9 [Ω] |
| | 2.00E-08 [F] 2500pF×8 | 19 [Ω] | 0.6 [Ω] |
| | 2.50E-08 [F] 2500pF×10 | 15 [Ω] | 0.5 [Ω] |

$Z = 1/2\pi fc$

SUBSTRATE TREATMENT APPARATUS

BACKGROUND OF THE INVENTION

Field of the Invention

The present invention relates to a substrate treatment apparatus used for substrate treatment such as film formation.

Background Art

U.S. Pat. No. 5,366,585 discloses a film formation apparatus provided with a plasma treatment reaction chamber.

There are substrate treatment apparatuses that generate plasma between a lower electrode and an upper electrode by supplying AC power to the upper electrode while supplying a material gas to between the lower electrode and the upper electrode, and apply treatment to a substrate on the lower electrode. Such substrate treatment apparatuses require a high voltage DC power supply that applies a voltage to the lower electrode to suck the substrate to the lower electrode using an electrostatic chuck. However, there is a problem that the above-described AC power may cause damage to the high voltage DC power supply.

SUMMARY OF THE INVENTION

The present invention has been made to solve the above-described problem and it is an object of the present invention to provide a substrate treatment apparatus capable of protecting an electrostatic chuck DC power supply from AC power.

The features and advantages of the present invention may be summarized as follows.

According to one aspect of the present invention, a substrate treatment apparatus includes a lower electrode formed of a dielectric, an upper electrode provided opposite to the lower electrode, a first AC power supply that is connected to the upper electrode and supplies AC power at a first frequency, a second AC power supply that is connected to the upper electrode and supplies AC power at a second frequency which is lower than the first frequency, an internal electrode provided in the lower electrode, a filter circuit connected to the internal electrode, and a DC power supply connected to the internal electrode via the filter circuit, the DC power supply is provided for an electrostatic chuck, wherein the filter circuit includes a first filter circuit that becomes low impedance with respect to AC power at the first frequency compared to AC power at the second frequency, and a second filter circuit that becomes low impedance with respect to AC power at the second frequency compared to AC power at the first frequency.

Other and further objects, features and advantages of the invention will appear more fully from the following description.

DETAILED DESCRIPTION OF THE PREFERRED EMBODIMENTS

Figure 1:
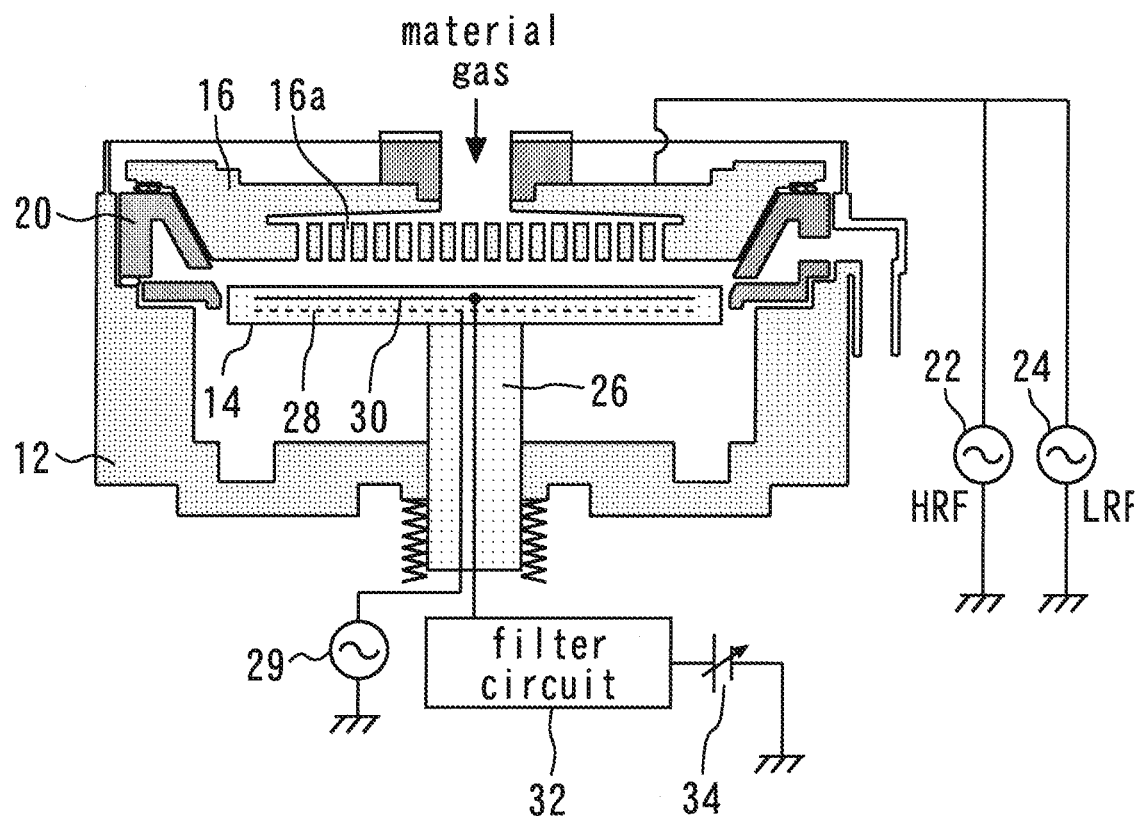
FIG. 1 is a cross-sectional view of a substrate treatment apparatus according to a first embodiment.

A substrate treatment apparatus according to an embodiment of the present invention will be described with reference to the accompanying drawings. Identical or corresponding components may be assigned identical reference numerals and redundant description may be omitted.

First Embodiment

FIG. 1 is a cross-sectional view of a substrate treatment apparatus according to a first embodiment. The substrate treatment apparatus is provided with a chamber 12. A lower electrode 14 formed of a dielectric and an upper electrode 16 provided opposite to the lower electrode 14 are provided in the chamber 12. The material of the lower electrode 14 can be, for example, ceramics such as AlN. The upper electrode 16 is provided with a slit 16a. A material gas is supplied to between the lower electrode 14 and the upper electrode 16 through the slit 16a.

An exhaust duct 20 is fixed to the chamber 12 and the upper electrode 16 via an O ring. The exhaust duct 20 surrounds a space between the upper electrode 16 and the lower electrode 14. The gas supplied to between the upper electrode 16 and the lower electrode 14 and used for substrate treatment is exhausted to the outside through the exhaust duct 20.

A first AC power supply 22 and a second AC power supply 24 are connected to the upper electrode 16. The first AC power supply 22 supplies AC power at a first frequency. The second AC power supply 24 supplies AC power at a second frequency which is lower than the first frequency. The first frequency may have a frequency range of, for example, 1 to 30 MHz. This frequency band is called "HRF (high radio frequency)." The first AC power supply 22 according to the first embodiment supplies AC power at 13.56 MHz. The second frequency may have a frequency range of 100 kHz to 1000 kHz. This frequency band is called "LRF (low radio frequency)." The second AC power supply 24 of the first embodiment supplies AC power at 430 kHz.

The lower electrode 14 is supported by a support portion 26. The lower electrode 14 and the support portion 26 are integrated into a susceptor. The lower electrode 14 may also be called a "ground substrate electrode." A heater 28 is embedded in the lower electrode 14. The heater 28 is provided, for example, in a spiral form in a plan view. The heater 28 is connected to a power supply 29 via a wiring that passes through the support portion 26. The power supply 29 supplies a current to the heater 28, and the lower electrode 14 is thereby heated and the substrate on the lower electrode 14 is also heated.

An internal electrode 30 is provided in the lower electrode 14. The internal electrode 30 is a metal formed, for example, in a mesh shape in a plan view. The material of the internal electrode 30 is, for example, W. The internal electrode 30 is connected to a filter circuit 32 via a wiring that passes through the support portion 26. The internal electrode 30 is connected to a DC power supply 34 via the filter circuit 32. The DC power supply 34 applies a voltage to the internal electrode 30 in order to provide an electrostatic chuck.

Figure 2:
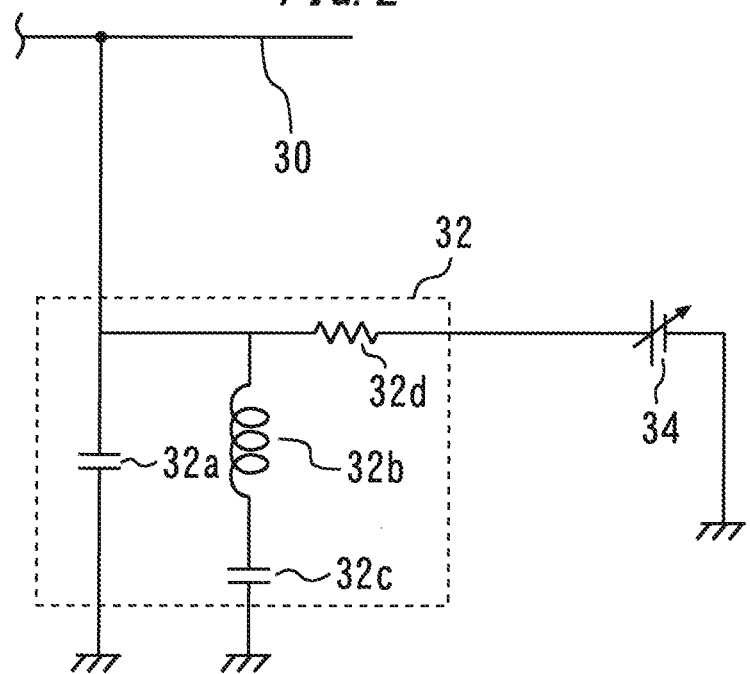
FIG. 2 is a circuit diagram of the filter circuit.

FIG. 2 is a circuit diagram of the filter circuit 32. The filter circuit 32 includes a capacitor 32a that connects the internal electrode 30 and the ground. The capacitor 32a is called a "first filter circuit." The first filter circuit is provided mainly to pass AC power at the first frequency supplied from the first AC power supply 22.

The filter circuit 32 is provided with an inductor 32b and a capacitor 32c. A wiring that connects the internal electrode 30 and the capacitor 32a is connected to the ground via the inductor 32b and the capacitor 32c. A series circuit of the capacitor 32c and the inductor 32b connects the internal electrode 30 and the ground. The capacitor 32c and the inductor 32b are jointly called a "second filter circuit." The second filter circuit is provided mainly to pass AC power at the second frequency supplied from the second AC power supply 24.

Furthermore, a resistor 32d is connected between the internal electrode 30 and the DC power supply 34. The resistor 32d is provided to prevent the AC power at the first frequency or the second frequency from being applied to the DC power supply 34. However, in the first embodiment of the present invention, since the first filter circuit and the second filter circuit are provided as described above, it is unlikely that AC power may be applied to the DC power supply 34. Thus, the resistor 32d is provided preliminarily and may be omitted.

(Operation of Substrate Treatment Apparatus)

Figures 3, 4:
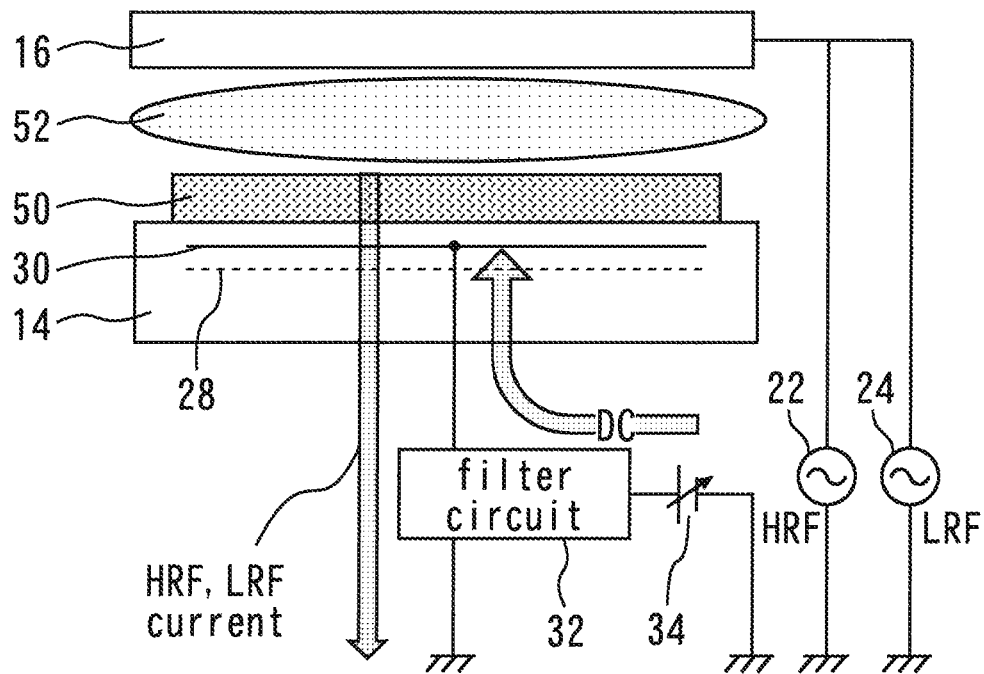
FIG. 3 is a diagram simply expressing the configuration in FIG. 1.
FIG. 4 is a table illustrating how the impedance of the capacitor changes depending on the capacitance.

Operation of the substrate treatment apparatus during substrate treatment will be described. FIG. 3 is a diagram simply expressing the configuration in FIG. 1 to describe operation during substrate treatment in a way easy to understand. Treatment is started with a substrate 50 placed on the lower electrode 14. The substrate 50 is, for example, a Si wafer. The substrate 50 is heated to a predetermined temperature by the heater 28 as required. AC power is supplied to the upper electrode 16 using the first AC power supply 22 and the second AC power supply 24 while supplying a material gas to between the upper electrode 16 and the lower electrode 14. By applying the AC power at the first frequency and the AC power at the second frequency to the upper electrode 16 in a superimposed fashion, plasma 52 is generated between the upper electrode 16 and the lower electrode 14. If the DC power supply 34 applies a voltage to the internal electrode 30 in this condition, the lower electrode 14 is polarized and an electrostatic chuck can be provided. That is, the substrate 50 on the lower electrode 14 is electrostatically attracted to the lower electrode 14. Note that since there is only one internal electrode 30 in the first embodiment of the present invention, it is possible to provide an electrostatic chuck only when plasma is generated.

For example, when plasma CVD is applied to the substrate 50 using this substrate treatment apparatus, the substrate 50 may warp. The warpage of the substrate 50 is assumed to be attributable to a temperature difference between the susceptor and the substrate when the substrate 50 is conveyed to the high temperature susceptor. There is a problem that the substrate 50 warps significantly in a manufacturing step of a 3D-NAND memory in particular. However, according to the substrate treatment apparatus according to the first embodiment of the present invention, the substrate 50 is electrostatically attracted to the lower electrode 14, and it is thereby possible to fix the substrate 50 to the lower electrode 14 while suppressing warpage of the substrate 50.

Furthermore, the first filter circuit including the capacitor 32a can pass AC power at the first frequency and the second filter circuit including the inductor 32b and the capacitor 32c can pass AC power at the second frequency. For example, an impedance of the second filter circuit including the inductor 32b having an inductance L of 1.3699 mH and the capacitor 32c having a capacitance of 100 pF calculated with respect to AC power at 430 kHz is approximately 0.12345 $\Omega$. In this calculation, a phase of the AC power is assumed to be −90°. Furthermore, when a capacitance of the capacitor 32a of the first filter circuit is assumed to be 25000 pF, an impedance with respect to the AC power at 13.56 MHz is as small as 0.5 $\Omega$. Note that in this example, a joint capacitance corresponding to 430 kHz is 2.5 $\Omega$.

(Comparative Example)

Here, a comparative example will be considered in which no second filter circuit is provided and only the first filter circuit is provided. A substrate treatment apparatus in the comparative example is substantially the same as the substrate treatment apparatus in FIG. 1, but is different from the substrate treatment apparatus in FIG. 1 in that the inductor 32b and the capacitor 32c in FIG. 2 are omitted. In the case of the comparative example, the first filter circuit needs to be low impedance with respect to both the AC power at the first frequency and the AC power at the second frequency. Such a first filter circuit can be implemented by increasing the capacitance of the capacitor of the first filter circuit.

FIG. 4 is a table illustrating how the impedance of the capacitor provided as the first filter of the comparative example changes depending on the capacitance. For example, when the capacitance of the capacitor is assumed to be 2500 pF×5, the impedance with respect to AC power at 13.56 MHz is as good as 0.9 $\Omega$, whereas the impedance corresponding to AC power at 430 kHz is as high as 30 $\Omega$. However, if the capacitance of the capacitor is increased up to 2500 pF×10, the impedance with respect to AC power at 13.56 MHz becomes 0.5 $\Omega$, and the impedance corresponding to AC power at 430 kHz becomes 15 $\Omega$. Therefore, if the capacitance of the capacitor 32a is increased considerably, a relatively low impedance can be provided for both the AC power at the first frequency and the AC power at the second frequency. However, considerably increasing the capacitance of the capacitor is not desirable since this would lead to an increase in size of the apparatus.

(Substrate Treatment Apparatus According to First Embodiment)

The first embodiment of the present invention provides the filter circuit capable of passing AC power at HRF and LRF to the ground. Therefore, it is possible to provide the filter circuit 32 that functions as a filter that grounds the AC power at the first frequency and the AC power at the second frequency without increasing the size of the capacitor as in the case of the comparative example. By providing the filter circuit 32, it is possible to normally generate discharge between the upper electrode 16 and the lower electrode 14 and also protect the DC power supply 34 provided for an electrostatic chuck from AC power.

(Modification)

The substrate treatment apparatus according to the first embodiment of the present invention can be modified in various ways without losing its features. By providing the capacitor 32a as the first filter circuit, it is possible to pass AC power at the first frequency at, for example, approximately 13.56 MHz in quite a simple configuration. However, the configuration of the first filter circuit is not particularly limited as long as it is a circuit that becomes low impedance with respect to the AC power at the first frequency compared to the AC power at the second frequency.

Although the second filter circuit is composed of L and C, the second filter circuit is not particularly limited as long as it is a circuit that becomes low impedance for the AC power at the second frequency compared to the AC power at the first frequency. The treatment contents of the substrate treatment apparatus according to the first embodiment of the present invention are not particularly limited as long as they are accompanied by plasma treatment. The substrate treatment apparatus may be used as a plasma CVD apparatus or used as a plasma etching apparatus. These modifications can be applied to the substrate treatment apparatuses according to the following embodiments. Note that since the substrate treatment apparatuses according to the following embodiments have many points common to the substrate treatment apparatus according to the first embodiment, the description will focus on points different from the first embodiment.

Second Embodiment.

Figure 5:
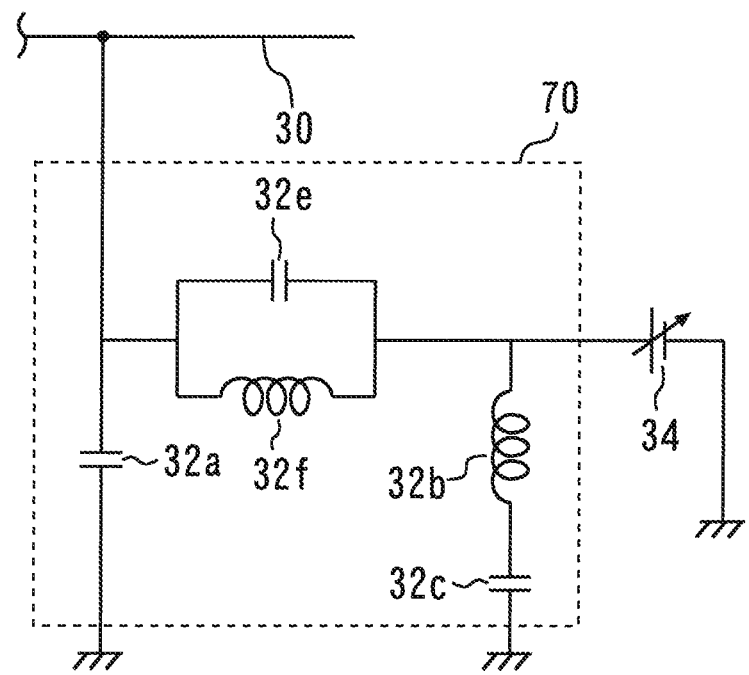
FIG. 5 is a diagram illustrating a filter circuit of a substrate treatment apparatus according to a second embodiment.

FIG. 5 is a diagram illustrating a filter circuit 70 of a substrate treatment apparatus according to a second embodiment. The filter circuit 70 is provided with a third filter circuit composed of a parallel circuit of a capacitor 32e and an inductor 32f. The third filter circuit is provided between the internal electrode 30 and the DC power supply 34 by avoiding a path connecting the internal electrode 30 and the capacitor 32a which is the first filter circuit. That is, the third filter circuit is connected to a wiring which is branched from the wiring that connects the internal electrode 30 and the capacitor 32a.

The third filter circuit is formed so as to become low impedance with respect to AC power at the second frequency and become high impedance with respect to AC power at the first frequency. That is, the third filter circuit functions as a high-cut filter. Suppose a case where a capacitance of the capacitor 32e is 100 pF and an inductance L of the inductor 32f is 1.3776 μH. In this case, the impedance of the third filter circuit with respect to AC power at 13.56 MHz is 2E+7Ω. The phase of the AC power is assumed to be −90°. The impedance of the third filter circuit with respect to AC power at 430 kHz is 3.72570Ω. The phase of the AC power is assumed to be 90°. When the inductance L of the inductor 32b of the second filter circuit is assumed to be 1.3699 mH and the capacitance of the capacitor 32c is assumed to be 100 pF, the impedance of the second filter with respect to AC power at 430 kHz can be set to 0.123458Ω. A joint impedance with respect to 430 kHz in this case is 3.0Ω.

Thus, the third filter circuit becomes low impedance with respect to AC power at the second frequency compared to AC power at the first frequency. Since the third filter circuit cuts AC power at the first frequency, it is possible to prevent the AC power from damaging the DC power supply 34.

Third Embodiment.

Figure 6:
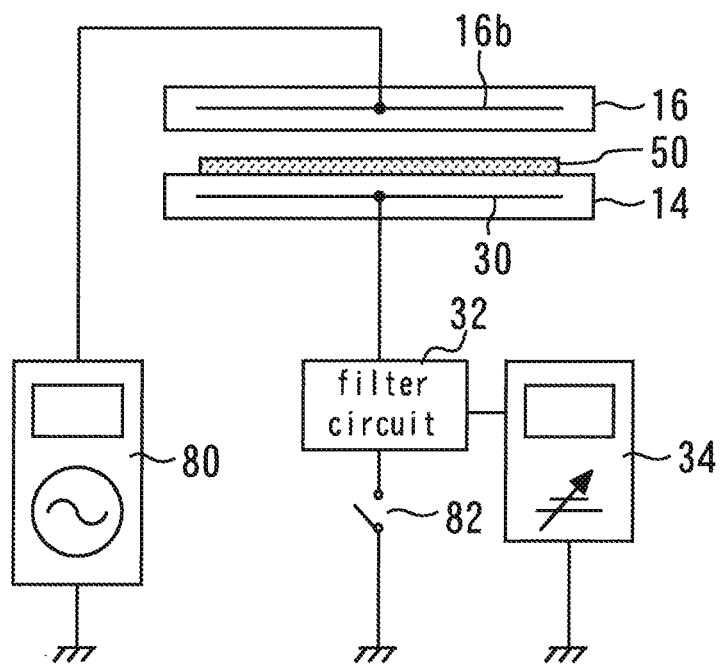
FIG. 6 is a diagram illustrating a substrate treatment apparatus according to a third embodiment.

FIG. 6 is a diagram illustrating a substrate treatment apparatus according to a third embodiment. An AC power supply 80 supplies AC power to the internal electrode 16b of the upper electrode 16. The DC power supply 34 is connected to the internal electrode 30 via the filter circuit 32. The internal electrode 30 is provided in the lower electrode 14. The DC power supply 34 applies a voltage to the internal electrode 30, and thereby provides an electrostatic chuck.

A switch 82 can switch connection or disconnection between the internal electrode 30 and the ground. The switch 82 connects the internal electrode 30 to the ground for a period during which treatment is applied to the substrate and keeps the internal electrode 30 disconnected from the ground for other periods. Therefore, the period during which plasma is generated and treatment is applied to the substrate, AC power applied to the upper electrode 16 flows to the ground via both the filter circuit 32 and the switch 82. Furthermore, the DC power supply 34 is applied to the internal electrode 30 during this period, and it is thereby possible to provide an electrostatic chuck.

Fourth Embodiment.

Figure 7:
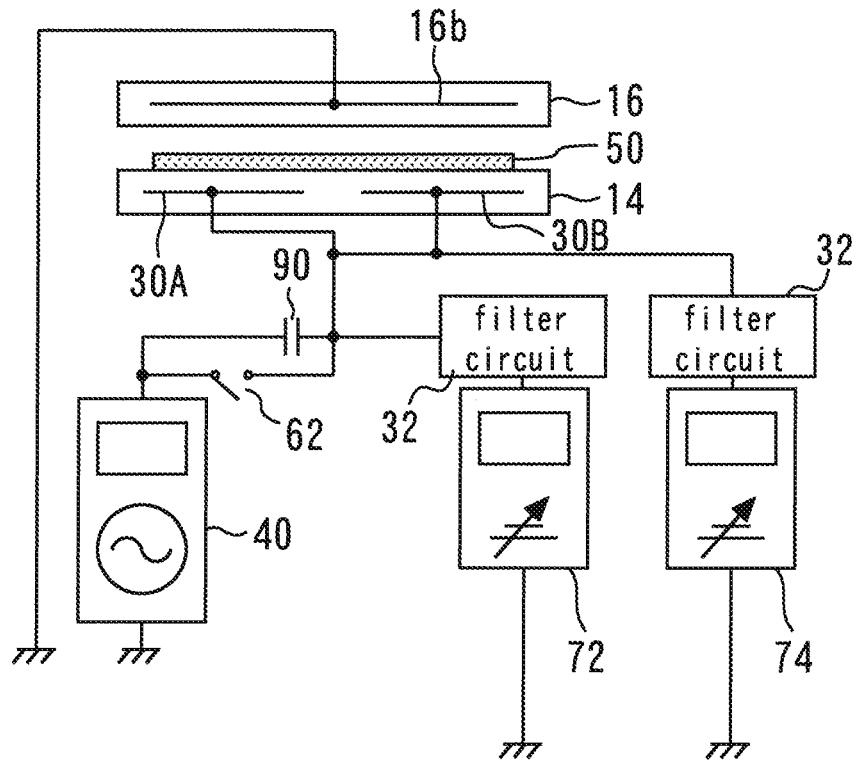
FIG. 7 is a diagram illustrating a substrate treatment apparatus according to a fourth embodiment.

In the embodiments described so far, the lower electrode 14 includes only one internal electrode, but the lower electrode 14 according to a fourth embodiment includes two internal electrodes. FIG. 7 is a diagram illustrating a substrate treatment apparatus according to the fourth embodiment. The internal electrode 16b in the upper electrode 16 is grounded. The lower electrode 14 is provided with two internal electrodes 30A and 30B. AC power is supplied to the two internal electrodes 30A and 30B from the AC power supply 40 to generate plasma. DC power is supplied to the two internal electrodes 30A and 30B from the DC power supply 72 and DC power supply 74 respectively. One filter circuit 32 is provided between AC power supply 40 and DC power supply 72. And the other filter circuit 32 is provided between AC power supply 40 and DC power supply 74.

A parallel circuit of a blocking capacitor 90 and a switch 62 is placed in an AC power supply path. When the switch 62 is closed, AC power is supplied to the internal electrodes 30A and 30B while the filter circuits 32 prevent AC power from being applied to DC power supplies 72, 74. A voltage is supplied to the internal electrode 30A from a DC power supply 72 and a voltage is supplied to the internal electrode 30B from the DC power supply 74. It is thereby possible to fix the substrate 50 using an electrostatic chuck while generating plasma between the upper electrode 16 and the lower electrode 14. By opening the switch 62, the blocking capacitor 90 separates the AC power supply 40 from the DC power supplies 72 and 74.

Figure 8:
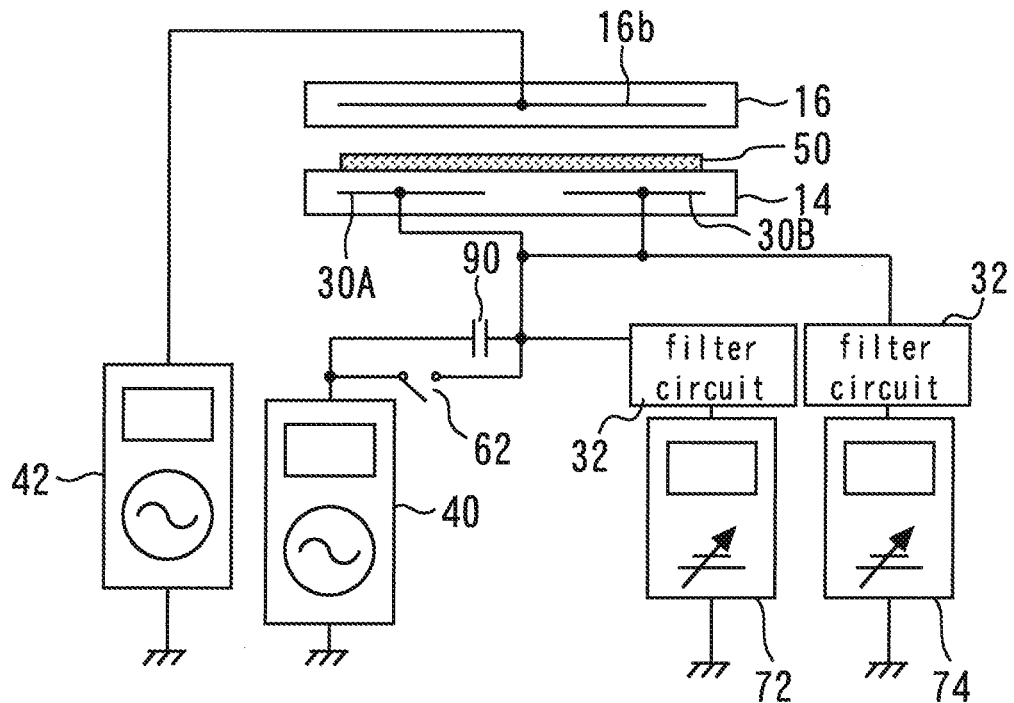
FIG. 8 is a diagram illustrating a substrate treatment apparatus according to a modification.

FIG. 8 is a diagram illustrating a substrate treatment apparatus according to a modification. This configuration is different from the configuration in FIG. 7 in that an AC power supply 42 supplies AC power to the internal electrode 16b of the upper electrode 16. Thus, plasma can be generated by two AC power sources. Note that the embodiments described so far may also be used in combination as appropriate.

The present invention provides the low impedance circuit for each of the plurality of AC power supplies and thereby connects the plurality of AC power supplies to the ground in low impedance. Thus, it is possible to protect the electrostatic chuck DC power supply from the AC power.

Obviously many modifications and variations of the present invention are possible in the light of the above teachings. It is therefore to be understood that within the scope of the appended claims the invention may be practiced otherwise than as specifically described.

What is claimed is:
1. A substrate treatment apparatus comprising:
   a lower electrode formed of a dielectric;
   an upper electrode provided opposite to the lower electrode;
   a first AC power supply that is connected to the upper electrode and supplies AC power at a first frequency;
   a second AC power supply that is connected to the upper electrode and supplies AC power at a second frequency which is lower than the first frequency;
   an internal electrode provided in the lower electrode;
   a filter circuit connected to the internal electrode; and
   a DC power supply connected to the internal electrode via the filter circuit, the DC power supply is provided for an electrostatic chuck,
   wherein the filter circuit comprises:

a first filter circuit that becomes low impedance with respect to AC power at the first frequency compared to AC power at the second frequency; and a second filter circuit that becomes low impedance with respect to AC power at the second frequency compared to AC power at the first frequency;

the first filter circuit comprises a capacitor that connects the internal electrode and a ground, the second filter circuit comprises a series circuit of a capacitor and an inductor connected in series with each other between the internal electrode and the ground, and the first filter circuit, the second filter circuit, and the DC power supply are each connected in parallel with each other between the internal electrode and the ground.

2. The substrate treatment apparatus according to claim 1, further comprising a third filter circuit that is provided between the internal electrode and the DC power supply avoiding a path connecting the internal electrode and the first filter circuit and becomes low impedance with respect to AC power at the second frequency compared to AC power at the first frequency.

3. The substrate treatment apparatus according to claim 2, wherein the third filter circuit is a parallel circuit of a capacitor and an inductor.

4. The substrate treatment apparatus according to claim 1, wherein the first frequency is 13.56 MHz, and the second frequency is 100 kHz to 1000 kHz.

5. The substrate treatment apparatus according to claim 1, further comprising a heater that is provided in the lower electrode and heats the lower electrode.

6. The substrate treatment apparatus according to claim 1, wherein plasma is generated between the upper electrode and the lower electrode by applying the AC power at the first frequency and the AC power at the second frequency to the upper electrode, and when the DC power supply applies a voltage to the internal electrode, the substrate on the lower electrode is electrostatically attracted to the lower electrode.

7. The substrate treatment apparatus according to claim 1, further comprising a resistor connected between the internal electrode and the DC power supply.

\* \* \* \* \*